United States Patent
Shirai et al.

(10) Patent No.: US 12,153,112 B2
(45) Date of Patent: Nov. 26, 2024

(54) MAGNETIC RESONANCE IMAGING APPARATUS, IMAGE PROCESSING APPARATUS, AND SIGNAL SEPARATION METHOD

(71) Applicant: FUJIFILM Healthcare Corporation, Kashiwa (JP)

(72) Inventors: Toru Shirai, Chiba (JP); Ryota Sato, Chiba (JP); Takashi Nishihara, Chiba (JP); Masahiro Takizawa, Chiba (JP); Yoshitaka Bito, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 147 days.

(21) Appl. No.: 18/118,265

(22) Filed: Mar. 7, 2023

(65) Prior Publication Data

US 2023/0288511 A1 Sep. 14, 2023

(30) Foreign Application Priority Data

Mar. 14, 2022 (JP) .................. 2022-039643

(51) Int. Cl.
*G01R 33/54* (2006.01)
*G01R 33/50* (2006.01)
*G01R 33/561* (2006.01)

(52) U.S. Cl.
CPC ........... *G01R 33/543* (2013.01); *G01R 33/50* (2013.01); *G01R 33/5616* (2013.01)

(58) Field of Classification Search
CPC ... G01R 33/50; G01R 33/543; G01R 33/5616
See application file for complete search history.

(56) References Cited

U.S. PATENT DOCUMENTS

| 7,202,665 | B1 | 4/2007 | Reeder |
| 7,468,605 | B2 | 12/2008 | Yu et al. |
| 9,977,105 | B2 * | 5/2018 | Shirai ............... A61B 5/00 |
| 11,341,642 | B2 * | 5/2022 | Hilbert ............ G01R 33/4828 |
| 11,953,571 | B2 * | 4/2024 | Weidlich ......... G01R 33/56527 |

FOREIGN PATENT DOCUMENTS

JP  6014266 B  9/2016

OTHER PUBLICATIONS

Cencini M, Biagi L, Kaggie JD, Schulte RF, Tosetti M, Buonincontri G. Magnetic resonance fingerprinting with dictionary-based fat and water separation (DBFW MRF): A multi-component approach. Magn Reson Med. 2019; 81: 3032â3045. https://doi.org/10.1002/mrm.27628 (Year: 2019).*

(Continued)

*Primary Examiner* — Gregory H Curran
(74) *Attorney, Agent, or Firm* — Paul Teng

(57) ABSTRACT

In an MRI image, signals from plural metabolites are accurately separated. A signal separation unit generates, as a dictionary, plural signal patterns in which values of variables of substances are changed based on prior information, and performs signal separation of the substances by matching the dictionary with a measured signal. At this time, an order of signal intensities of the substances is used as the prior information, and selection of a most matched dictionary for each of the substances is repeated while changing a dictionary used for matching according to the order.

15 Claims, 11 Drawing Sheets

(56) References Cited

OTHER PUBLICATIONS

European search report dated Aug. 7, 2023 in connection with European Patent Application No. 23 16 0355.
Daiki Tamada et al., "Mapping T1, T2, and proton density fat fraction of the liver using MR Fingerprinting with three-point DIXON and 6-point fat model", Proc Int'l Society for Magn Reson in Med, vol. 27, 4377 (Apr. 26, 2019).
Christian Guenthner et al., "Abdominal Water/Fat Separated MR Fingerprinting on a Lower-Field 0.75T MRI", Proc Int'l Society for Magn Reson in Med, vol. 29, 1557 (Apr. 20, 2021).
Aug. 2, 2024 official action by the European Patent Office in connection with European Patent Application No. 23 16 0355.6.

* cited by examiner

FIG.6
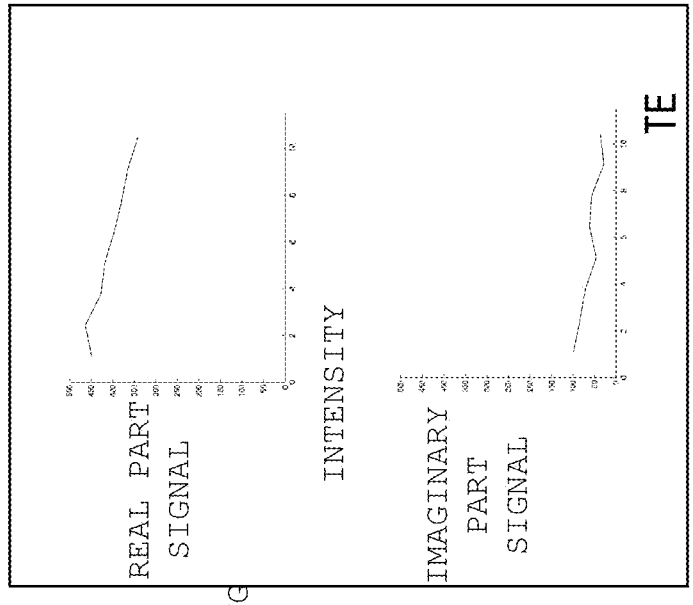
MEASURED SIGNAL
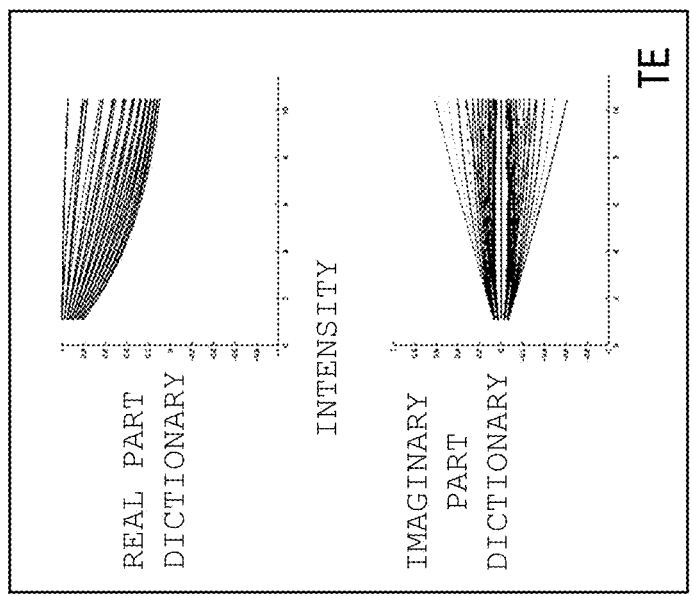
WATER SIGNAL DICTIONARY

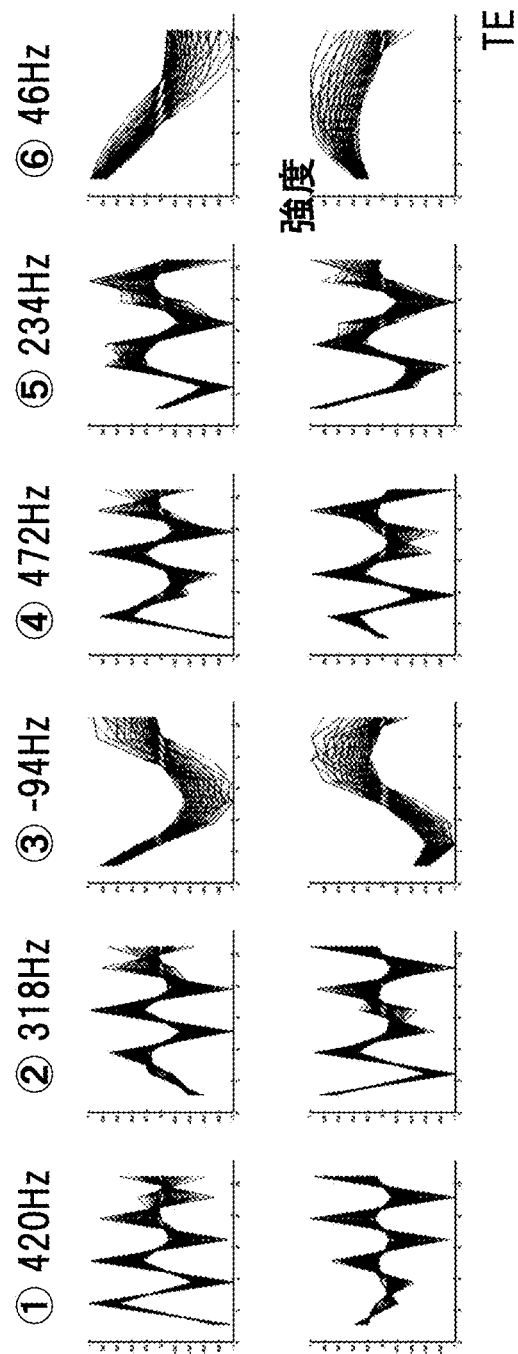

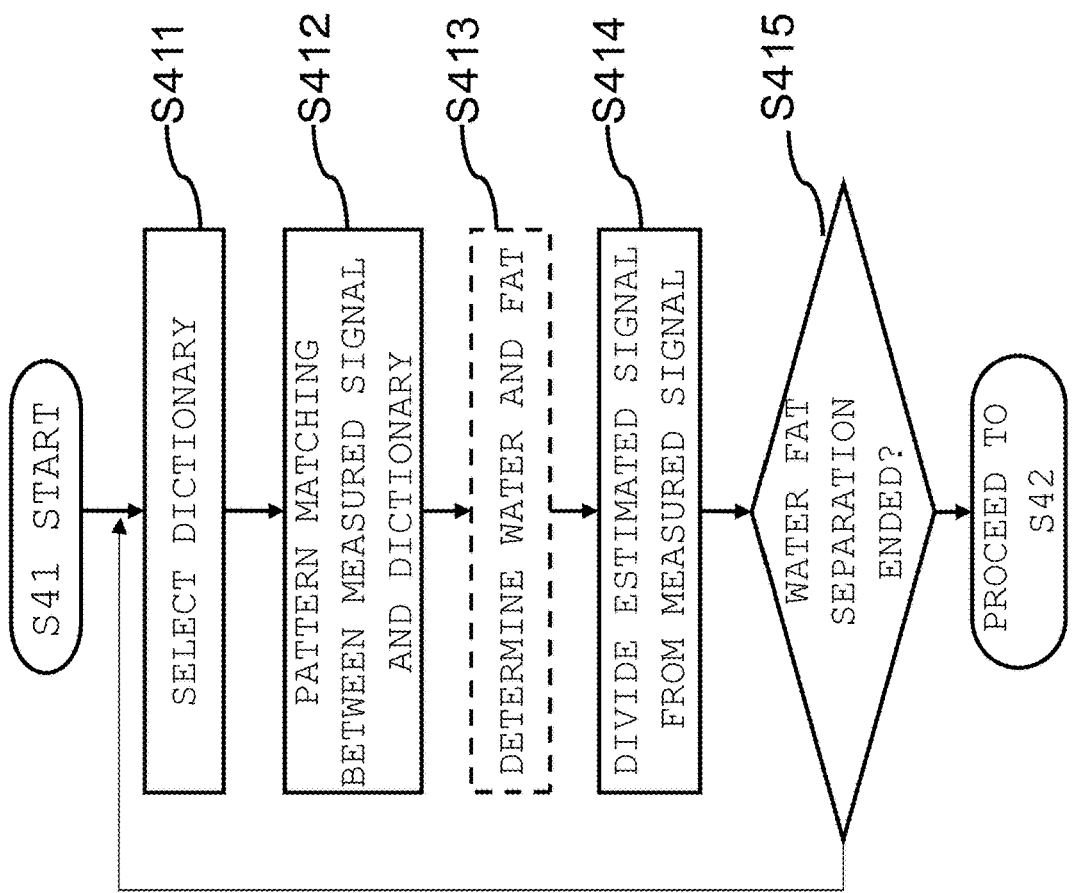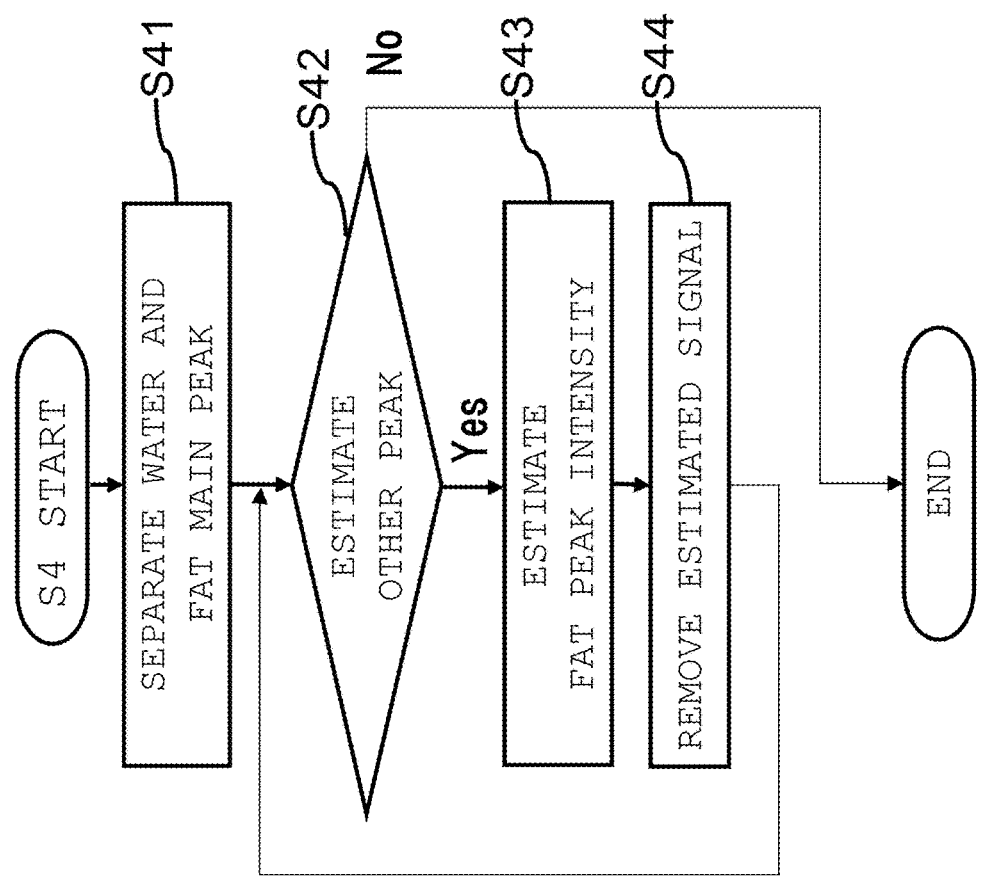

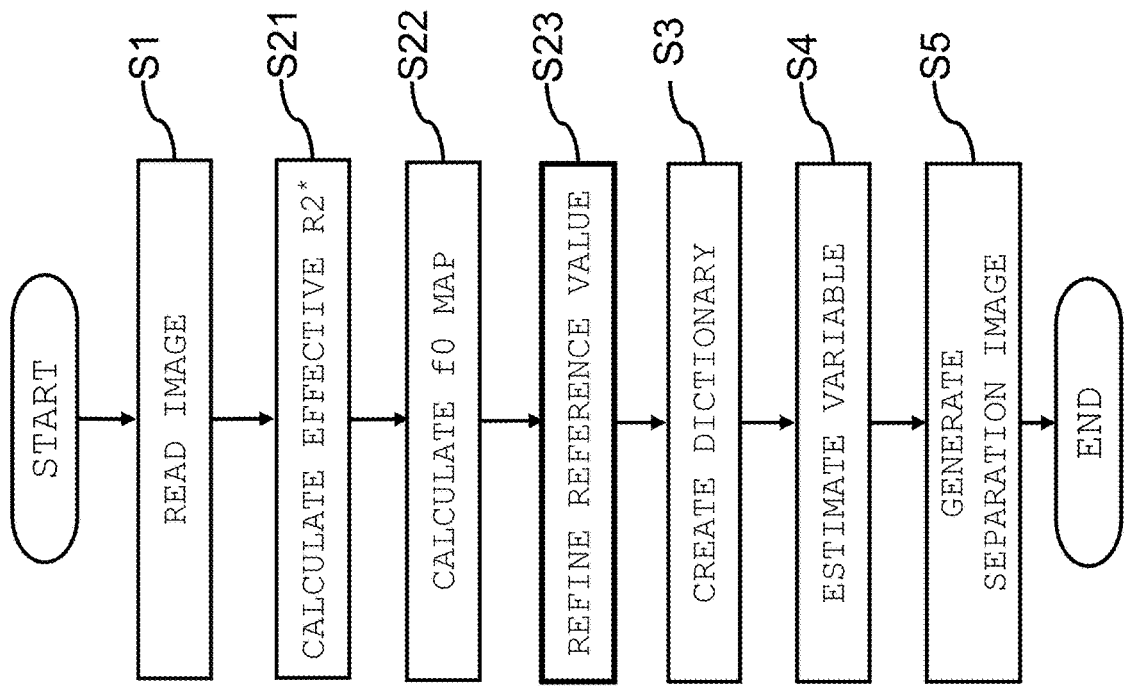

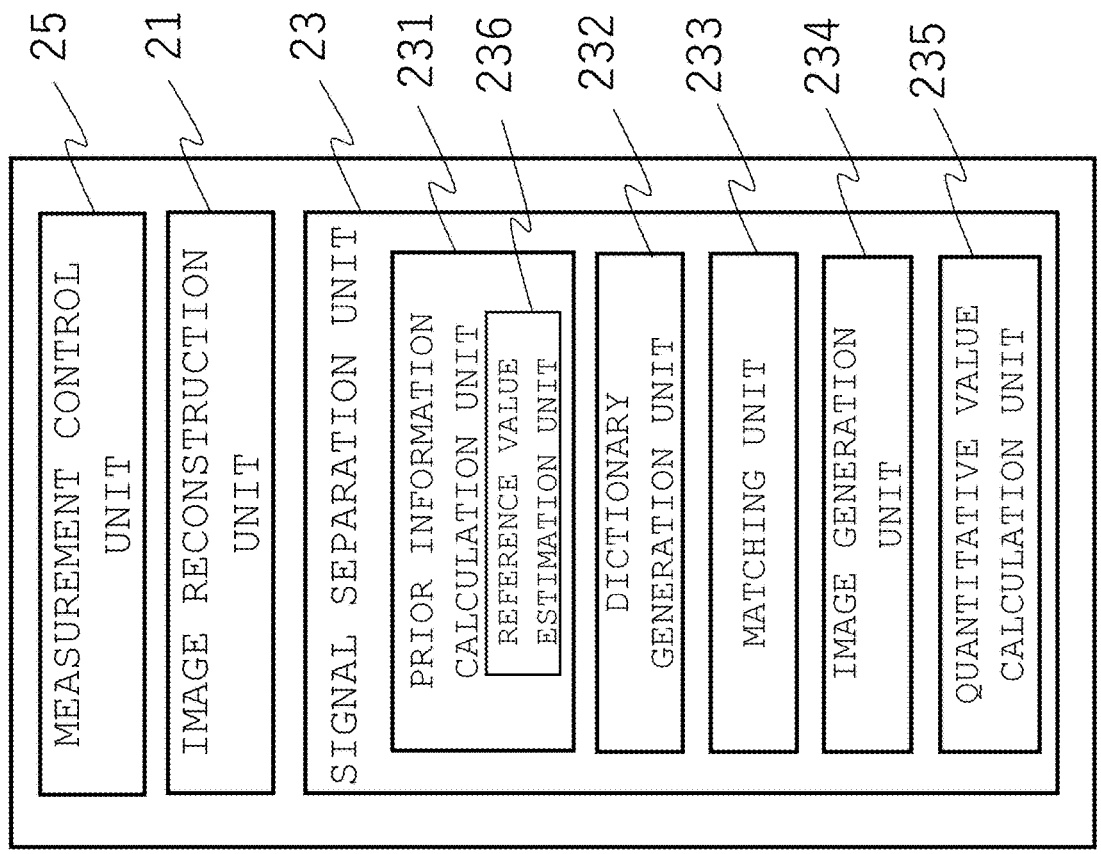

MAGNETIC RESONANCE IMAGING APPARATUS, IMAGE PROCESSING APPARATUS, AND SIGNAL SEPARATION METHOD

BACKGROUND OF THE INVENTION

1. Field of the Invention

The present invention relates to a magnetic resonance imaging apparatus (MRI apparatus), and more particularly to a technique for separating signals of plural metabolites contained in a subject in an image (MR image) acquired by the MRI apparatus.

2. Related Art

Nuclides targeted by an MRI apparatus are mainly hydrogen nuclei (protons), and an image obtained by the MRI apparatus is reconstructed using signals generated from the protons by nuclear magnetic resonance such as a density of protons in a tissue to be inspected. Since hydrogen is present mainly in molecules constituting water and fat in the tissue, for example, when imaging a tissue mainly containing water such as a blood flow, it is necessary to separate a signal (hereinafter referred to as a "fat signal") from fat mixed into a signal (hereinafter referred to as a "water signal") from a proton in water. In addition, main tissues that can be imaged by the MRI include subcutaneous fat, skeletal muscle, bone marrow, and the like, these tissues contain a large amount of fat, it is essential to separate the water signal and the fat signal in order to obtain a high contrast image, and it is important to improve accuracy of separation in order to improve image quality of the separated image.

As one of techniques for separating the water signal and the fat signal in MRI, there is a Dixon method using a difference in a resonance frequency between the water signal and the fat signal, that is, a chemical shift. In the Dixon method, plural echo signals having different TE are obtained by utilizing a fact that a phase difference between the water signal and the fat signal changes when an echo time TE is varied due to the difference in the resonance frequency. Images are calculated based on the echo signals having different TE, a signal model based on a Bloch equation is defined, and the water signal and the fat signal that are included in the image are separated using a non-linear least squares method.

In the Dixon method, as variables to be estimated, it is necessary to estimate a total of 10 variables, which are a signal intensity of water, signal intensities of peaks (for example, six peaks) of fat signals having different peaks due to a metabolite, apparent transverse magnetization relaxation rates $R2^*$ (reciprocal of $T2^*$) of water and fat, and static magnetic field inhomogeneity. Therefore, when all variables are to be calculated, at least 10 images of the echoes having different TE are required. In general, since an image is affected by noise, in order to improve accuracy of variable estimation, more echo images are required, and there is a problem that an imaging time is extended and the accuracy is lowered accordingly.

For this problem, especially the problem that the imaging time is extended, a method of fitting with fewer variables has been proposed. For example, in a technique described in US7, 202, 665B, variables and the number of echo images to be acquired are reduced using a signal model in which resonance frequencies and relative signal intensities of each metabolite are incorporated instead of the signal model based on the Bloch equation. In addition, in a technique described in US7, 468, 605B, a signal model is used to which an apparent transverse magnetization relaxation rate ($R2^*$) common to water and fat is applied. In this method, accuracy of an image including water and fat is improved as compared to a case where $R2^*$ is individually obtained.

SUMMARY OF THE INVENTION

By separating signals of metabolites that are summarized in water and fat, quantification of the metabolites contributing to image diagnosis is possible. For example, chronic liver disease often develops liver cancer through destruction and regeneration due to inflammation and progression of fibrosis, and accurate measurement (hepatic quantification MRI technique) of fat and iron accumulated in liver in order to grasp pathological conditions of the chronic liver disease becomes increasingly important. In order to accurately calculate a fat fraction (FF), it is important to improve the accuracy of signal separation. In addition, in the chronic liver disease, iron deposition occurs in addition to fat along with progress. Since the iron deposition appears as an increase in an apparent transverse magnetization relaxation rate $R2^*$ in MRI, diagnostic performance is improved by accurately grasping $R2^*$.

For these problems, in a method in US7, 202, 665B, a degree of accuracy of the calculated fat fraction is improved as compared with a signal model in which fat is regarded as one peak. However, since relative signal intensities of the peak are different depending on fat tissues such as subcutaneous fat, skeletal muscle, and bone marrow, there is a problem that the degree of accuracy of the fat fraction decreases depending on the tissues. In addition, the signal intensities of the peaks cannot be calculated.

In a method in US7, 468, 605B, since the signal model is used to which the apparent transverse magnetization relaxation rate $R2^*$ common to water and fat is applied, the accuracy of the image including water and fat is improved as compared to the case where $R2^*$ is individually obtained. However, a degree of accuracy of $R2^*$ is reduced in a pixel in which water and fat are mixed.

An object of the invention is to provide a new signal separation technique for solving the problems in improvement techniques of the Dixon method in the related art, that is, to individually calculate each peak intensity of multiple peaks of fat while reducing variables to be estimated, and to accurately calculate $R2^*$.

In order to solve the above problems, an MRI apparatus according to the invention generates, as a dictionary, plural signal patterns obtained by changing values of variables of substances based on prior information, instead of using one signal model, and performs signal separation of the substances by matching the dictionary with a measured signal. At this time, an order of signal intensities of the substances is used as the prior information, and selection of a most matched dictionary for each of the substances is repeated while changing a dictionary used for matching according to the order.

That is, the MRI apparatus according to the invention includes: a measurement unit configured to measure a nuclear magnetic resonance signal generated from a subject; and an arithmetic unit configured to perform an arithmetic operation including image reconstruction using the nuclear magnetic resonance signal. The arithmetic unit includes a signal separation unit configured to separate signals for respective plural metabolites contained in the subject using plural images created based on nuclear magnetic resonance signals collected by the measurement unit at different echo times. The signal separation unit includes: a dictionary generation unit configured to create, as a dictionary, plural signal patterns created by changing values of plural variables for each of the metabolites using prior information; and a matching unit configured to perform pattern matching between the dictionary for each of the metabolites created by the dictionary generation unit and the signal measured by the measurement unit and to select a most matched dictionary.

In addition, the invention includes an image the above processing apparatus having functions of arithmetic unit.

The prior information includes, for example, information on resonance frequencies and an order of signal intensities of the plural metabolites. The signal separation unit is configured to sequentially execute selection of the dictionary for each of the metabolites and matching using the selected dictionary according to these pieces of prior information and to separate the signals of the metabolites. The "signal patterns" created by changing the values of the plural variables are signal intensity patterns created by variously changing physical property (for example, proton density, $R2^*$, resonance values frequency, and B0 inhomogeneity=f0) of a metabolite and imaging conditions (for example, TE and $\Delta$TE).

A signal separation method according to the invention is a signal separation method for processing plural images created based on NMR signals (echo signals) measured at different echo times by MRI and separating signals for respective plural metabolites contained in a subject generating an echo signal. The signal separation method includes: a dictionary creation step of inputting information on resonance frequencies and an order of signal intensities of the plural metabolites as prior information and creating, as a dictionary, plural signal patterns having different values for each of the metabolites; and a matching step of performing pattern matching between the created plural signal patterns and the measured signal and selecting a most matched signal pattern. Selection of the dictionary and matching between a signal pattern included in the selected dictionary and the measured signal are sequentially performed according to the order of the signal intensities of the plural metabolites, and the signals of the metabolites are separated.

Further, the invention includes a program for causing a computer to execute each step in the above signal separation method.

According to the invention, individual metabolites, for example, individual fat components can be estimated by repeating estimation (signal separation) of signal patterns for each of the substances while using a dictionary of plural signal patterns having different variable values to vary the applied dictionary. In addition, a transverse magnetization relaxation rate $R2^*$ for each of the substances can be obtained, and accuracy of calculation of $R2^*$ can be improved. Accordingly, the metabolite can be quantified and a change in the metabolite accompanied by a change in a tissue can be grasped. For example, information contributing to diagnosis of liver diseases such as classification of liver cancer transitional fat liver and estimation of an amount of iron deposition in the liver can be provided.

BRIEF DESCRIPTION OF THE DRAWINGS

FIG. 6 is a diagram illustrating an example of a dictionary of a water signal.

FIG. 7 is a diagram illustrating an example of a dictionary of multiple peaks of fat.

FIG. 8A is a diagram illustrating details of a flow of signal separation, and FIG. 8B is a diagram illustrating details of step S41 in FIG. 8A.

FIG. 10 is a diagram illustrating a flow of processing according to a second embodiment.

FIG. 11 is a functional block diagram of a computer according to the second embodiment.

DESCRIPTION OF THE PREFERRED EMBODIMENTS

Hereinafter, embodiments of an MRI apparatus and a signal method according to the invention will be described with reference to the drawings. First, an overall configuration of an MRI apparatus 1 to which the invention is applied will be described.

Functional Configuration of MRI Apparatus

Figure 1:
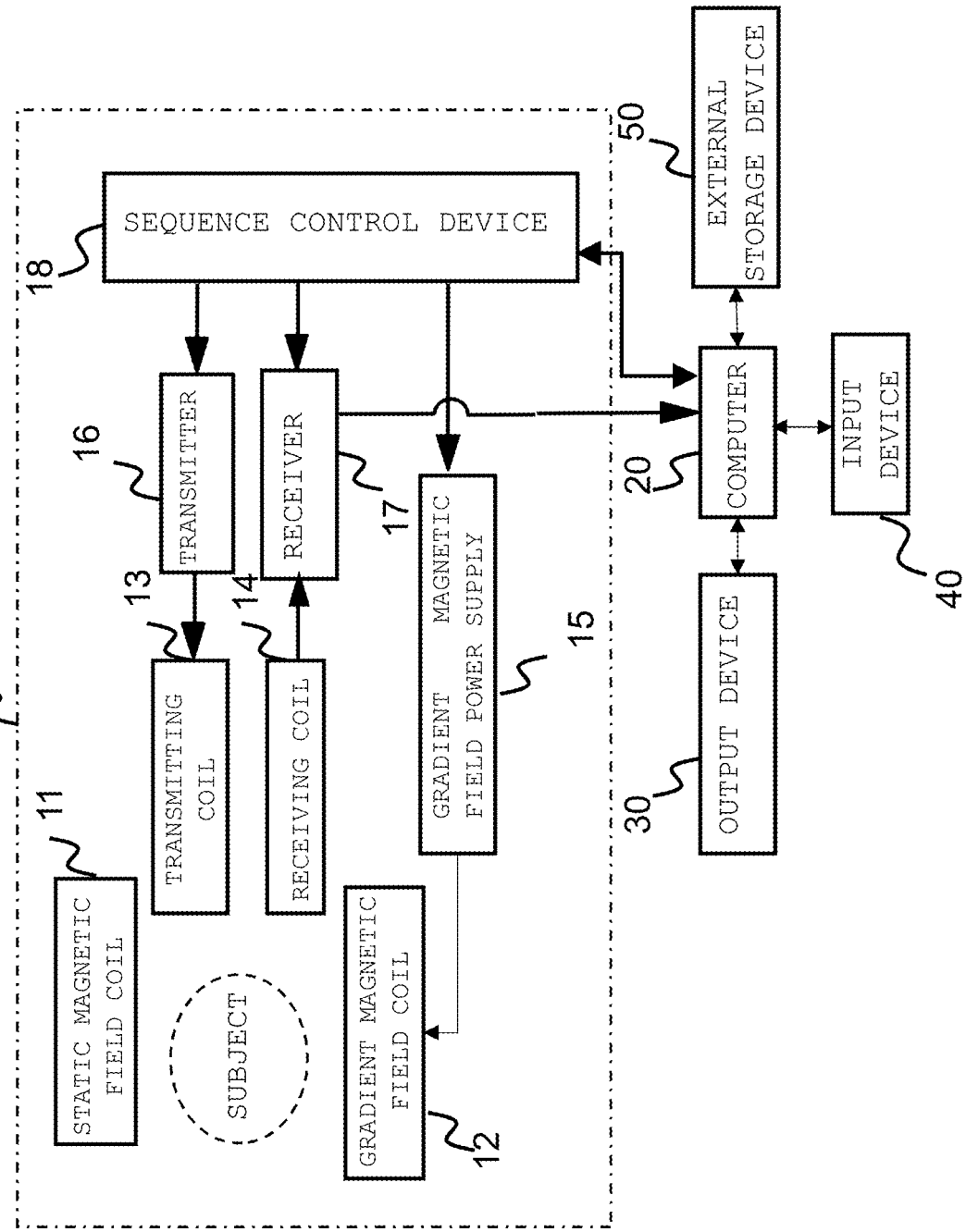
FIG. 1 is a diagram illustrating an overall configuration of an MRI apparatus to which the invention is applied.

As illustrated in FIG. 1, the MRI apparatus 1 according to the present embodiment includes: a static magnetic field generation unit such as a static magnetic field coil 11 that generates a static magnetic field in a space where a subject is placed; a transmitting high-frequency coil 12 (hereinafter simply referred to as a transmitting coil) and a transmitter 16 that transmit a high-frequency magnetic field pulse to a measurement region of the subject; a receiving high-frequency coil 13 (hereinafter simply referred to as a receiving coil) and a receiver 17 that receive a nuclear magnetic resonance signal generated from the subject; a gradient magnetic field coil 14 that applies a magnetic field gradient to the static magnetic field generated by the static magnetic field coil 11 and a gradient magnetic field power supply 15 that is a drive power supply of the gradient magnetic field coil 14; a sequence control device 18; and a computer 20 (arithmetic unit). Each of units of the MRI apparatus 1 other than the computer 20 is collectively referred to as a measurement unit 10.

The MRI apparatus 1 has a vertical magnetic field type or a horizontal magnetic field type depending on a direction of the generated static magnetic field, and various forms of the static magnetic field coil 11 are adopted according to the type. The gradient magnetic field coil 14 includes a combination of plural coils that generate gradient magnetic fields in three axial directions (x direction, y direction, and z direction) orthogonal to one another, and the coils are driven by the gradient magnetic field power supply 15. By applying the gradient magnetic field, position information can be added to the nuclear magnetic resonance signal generated from the subject.

A case where the transmitting coil 12 and the receiving coil 13 are separate is illustrated in an illustrated example, and one coil that functions as both the transmitting coil 12 and the receiving coil 13 may be used. A high-frequency magnetic field emitted by the transmitting coil 12 is generated by the transmitter 16. The nuclear magnetic resonance signal detected by the receiving coil 13 is sent to the computer 20 through the receiver 17.

The sequence control device 18 controls operations of the gradient magnetic field power supply 15, the transmitter 16, and the receiver 17, controls timings of application of the gradient magnetic field and the high-frequency magnetic field and reception of the nuclear magnetic resonance signal, and executes measurement. A time chart of the control is referred to as an imaging sequence, is set in advance according to the measurement, and is stored in a storage device or the like provided in the computer 20 to be described later.

The computer 20 is an information processing apparatus including a CPU, a memory, a storage device, and the like, controls operations of each of the units of the MRI apparatus via the sequence control device 18, performs arithmetic processing on a received echo signal, and obtains an image of a predetermined imaging region. Functions implemented by the computer 20 will be described later, and the functions may be implemented by the computer 20 provided in the MRI apparatus 1, or may be implemented by a computer, a workstation, or the like independent of the MRI apparatus. That is, the functions may be implemented by an image processing apparatus including a part or all of the functions of the computer 20.

A display device 30, an input device 40, an external storage device 50, and the like are connected to the computer 20. The display device 30 is an interface that displays a result obtained by the arithmetic processing and the like, to an operator. The input device 40 is an interface for the operator to input conditions, parameters, and the like necessary for the measurement and arithmetic processing that are performed in the present embodiment. A user can input measurement parameters such as the number of echoes to be measured, an echo time TE, and an echo interval via the input device 40. The external storage device 50 stores data used for various types of arithmetic processing executed by the computer 20, data obtained by the arithmetic processing, received conditions, parameters, and the like, together with a storage device inside the computer 20.

As described above, the computer 20 performs control of the measurement unit 10 of the MRI apparatus and processing of a signal measured by the measurement unit 10, but the nuclear magnetic resonance signal measured by the measurement unit 10 is obtained as a sum of signals from various substances (in particular, a substance containing hydrogen) contained in a tissue, and the computer 20 according to the present embodiment has a function of separating the signals of the substances as a part of the signal processing.

Figure 2:
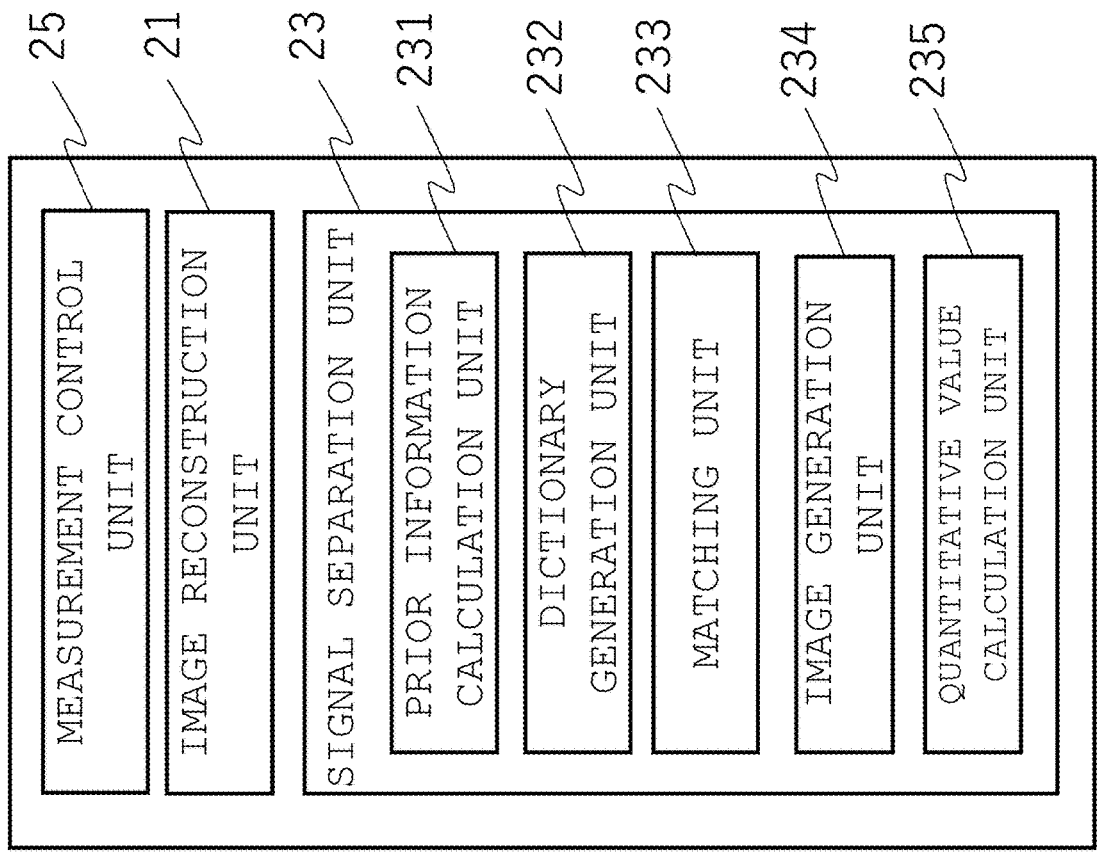
FIG. 2 is a functional block diagram of a computer provided in the MRI apparatus.

FIG. 2 illustrates a configuration of the computer 20 that implements such a function. As illustrated, the computer 20 according to the present embodiment includes: an image reconstruction unit 21 that performs an arithmetic operation such as Fourier Transform for measurement data for each of echo times TE collected by the measurement unit 10 to generate an image (echo image) for each of echo times; a signal separation unit 23 that uses the echo images generated by the image reconstruction unit 21 to separate signals of substances mixed in the images; and a measurement control unit 25 that controls the measurement unit 10. The signal separation unit 23 includes a dictionary generation unit 232 and a matching unit 233, and may further include a prior information calculation unit 231. The signal separation unit 23 may further include an image generation unit 234 that generates a calculation image using a signal separated by the signal separation unit 23 or a variable, and a quantitative value calculation unit 235 that calculates an amount, a ratio, and the like of a metabolite in a predetermined tissue using values of variables obtained for each of metabolites.

The dictionary generation unit 232 substitutes resonance frequencies (known information) of the metabolites obtained as prior information into a signal model based on a Bloch equation to calculate a signal pattern, and creates a dictionary for each of the metabolites.

The prior information calculation unit 231 calculates a predetermined value of a variable that can be calculated based on measurement data or the like from variables included in the signal model used by the dictionary generation unit 232, and generates the value as prior information (second prior information) used by the dictionary generation unit 232. The variable calculated by the prior information calculation unit 231 is not limited, and may be either one or both of, for example, an apparent transverse magnetization relaxation rate $R2^*$ and a static magnetic field distribution f0. In the dictionary creation, the variable calculated by the prior information calculation unit 231 is not necessarily calculated as a predetermined value, and in this case, the prior information calculation unit 231 can be omitted.

When the prior information calculation unit 231 calculates the above value of the variable as the prior information, the dictionary generation unit 232 creates plural signal patterns by setting the value as a reference value of the variable and substituting a value in a predetermined range based on the reference value into the signal model. The dictionary generation unit 232 registers the plural signal patterns created for the metabolites in a memory or the like in the computer as a dictionary for each of the metabolites.

The signal pattern created as a dictionary may be a time-series signal pattern (measured signal) representing a signal value on a time axis, or may be a spectral signal pattern obtained by performing Fourier transform on the time-series signal pattern. In this case, a spectral signal obtained by performing Fourier transform is also used as measurement data.

The matching unit 233 matches the signal pattern with the measurement data using a corresponding dictionary in order based on an order of magnitudes of signal intensities of the metabolites (peaks) registered as prior information (first prior information) based on the registered signal pattern, and separates signals of the metabolites by repeating the matching while sequentially removing a matched signal. In the signal separation, information on a magnitude of the apparent transverse magnetization relaxation rate may be used as the prior information.

Figure 3:
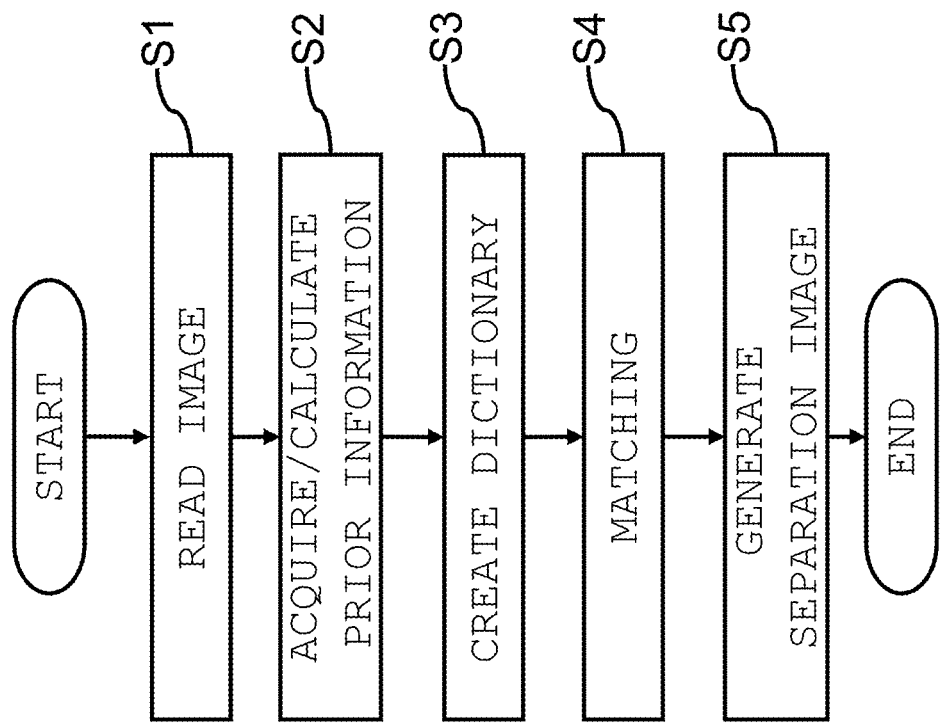
FIG. 3 is a diagram illustrating a flow of signal separation processing.

FIG. 3 illustrates a flow of processing performed by each of the units of the signal separation unit 23 described above. First, the echo image generated by the image reconstruction unit 21 is read (S1), and in one embodiment, the prior information calculation unit 231 calculates prior information that can be calculated based on the echo image (S2).

Next, the dictionary generation unit 232 acquires the prior information calculated by the prior information calculation unit 231, and creates a dictionary of the signal pattern for each of the substances (S3). Further, in each dictionary, the dictionary generation unit 232 generates plural signal patterns in which the value of the variable (value calculated as prior information) is varied in a predetermined range. In an embodiment in which the prior information calculation unit 231 is omitted or the reference value calculation by the prior information calculation unit 231 is omitted, a dictionary is created by substituting plural discrete values (fixed values) to a predetermined variable.

A size of one dictionary created for each of the substances depends on the number of the varied variables.

Thereafter, the matching unit 233 matches the plural signal patterns that are included in the dictionary created by the dictionary generation unit 232 with the measurement data (signal values of echo images) for each of the metabolites, and determines a most matched signal pattern (S4). A signal intensity of the determined signal pattern is set as a signal intensity of the metabolite (S4).

The matching unit 233 repeats the processing (S4) described above with different dictionaries to be used. In this repetition, an order of the dictionaries to be used is determined with reference to the prior information. The prior information used here is the order of the magnitudes of the signal intensities of the substances. For example, in a water signal and a fat signal, which signal intensity is strong is known depending on the tissue, an order of magnitudes of peak values for fat components is known. Such known information is used as the prior information. In addition, a relationship between an apparent transverse magnetization relaxation rate R2*w of water and an apparent transverse magnetization relaxation rate R2*f of fat, that is, R2*w<R2*f may be used as the prior information. The matching unit 233 matches the dictionary with the measured signal, and at that time, repeats processing of removing a signal estimated to be a signal of a predetermined metabolite by matching from measured signals before processing, thereby finally separating signals for the respective metabolites.

By determining the signal patterns for each of the metabolites, R2* for each of the metabolites and static magnetic field inhomogeneity f0 can be obtained based on the values of the variables set for the signal patterns in addition to the signal intensities for each of the metabolites.

Thereafter, the image generation unit 234 may generate a display image using the signals obtained for each of the metabolites, or the quantitative value calculation unit 235 may calculate the amount, the ratio, and the like of the metabolite in the predetermined tissue.

As described above, the signal separation unit 23 uses dictionaries (dictionaries including plural signal patterns) the number of which corresponds to the metabolites, selects a predetermined dictionary according to the order of the magnitudes of the signal intensities of the substances, and matches the signal pattern with the measurement data, and thereby it enables to calculate the signal intensities and R2* of the metabolites with high accuracy with a small number of pieces of measurement data, that is, a small number of echo images and improve accuracy of quantification of the metabolites.

The invention can be applied to various metabolites having different chemical shifts such as water, fat, choline, and metabolites thereof, and is particularly suitable for separation between water and fat components. Hereinafter, a specific embodiment of processing of the signal separation unit 23 will be described by taking the separation of water and the fat components as an example.

First Embodiment

Figure 4:
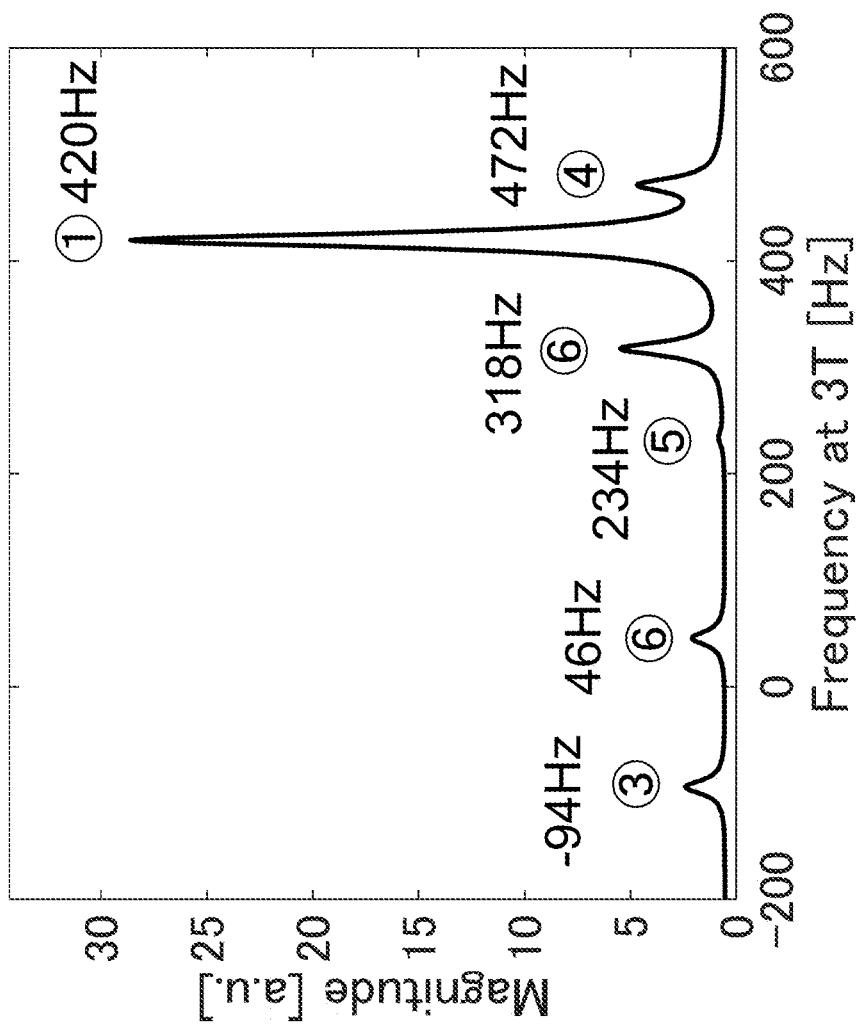
FIG. 4 is a diagram illustrating multiple peaks of fat.

In the present embodiment, a water signal and signals of fat components included in a tissue are separated. As illustrated in FIG. 4, a fat signal is a multi-peak signal having six peaks such as a peak of a $CH_2$ group, a peak of a $CH_3$ group, and a peak of a $CH_2CH=CHCH_2$ group. Although resonance frequencies of the peaks are known, peak intensities vary depending on compositions of lipids, and it may be possible to determine types of the lipids by estimating the intensities of the individual peaks. In addition, although the intensities of the peaks vary depending on the compositions, a peak having a maximum peak intensity is the peak of the $CH_2$ group, and a relative relationship of the peak intensities, that is, an order of the magnitudes of the peak intensities is substantially the same.

In the present embodiment, signals pattern for each of resonance frequencies of the peaks are created as a dictionary, and the signal intensities of the peaks (that is, metabolites) are estimated by matching the measured signal with the signal pattern. In creating the dictionary, values of a provisional effective R2* and the static magnetic field inhomogeneity f0 are calculated as prior information, and plural signal patterns are created by varying the effective R2* and the static magnetic field inhomogeneity f0 in a predetermined range based on the calculated values. The matching between the signal pattern and the measurement data is sequentially performed for each of the peaks (for each of components having different resonance frequencies), the signal patterns of the peaks are determined, and signal separation is performed. When the signal separation for each of the peaks is sequentially performed, the order of the peak intensities is used as the prior information, and the matching is performed in descending order of the signal intensities.

Figure 5:
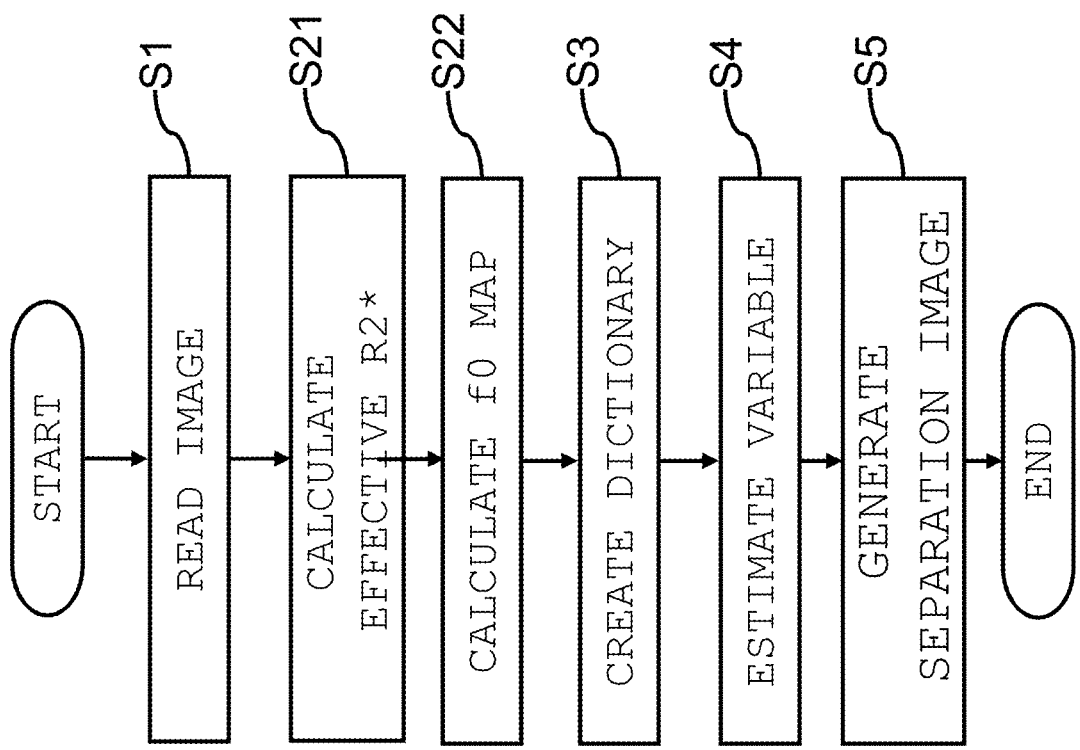
FIG. 5 is a diagram illustrating a flow of processing according to a first embodiment.

Hereinafter, a flow of processing by the signal separation unit 23 will be described with reference to FIG. 5. In FIG. 5, the redundant description of the same processing as in FIG. 3 will be omitted.

S1: Measurement and Image Acquisition

First, as a premise, the measurement control unit 25 controls the measurement unit 10 via the sequence control device 18, and collects plural pieces of measurement data having different TE. A pulse sequence for the measurement unit 10 to collect the measurement data is not particularly limited as long as the pulse sequence is a pulse sequence capable of collecting the number of echo signals required for reconstruction of one image for each of TE. The number of pieces of the measurement data may be a number obtained by combining water and the fat components, here, 7 or more, and may be less than 10 necessary for a Dixon method in the related art. The image reconstruction unit 21 reconstructs the plural pieces of measurement data collected by the measurement unit 10, and obtains plural (N) echo images. The signal separation unit 23 reads these images.

S2: Calculation of Prior Information

The signal separation unit 23 calculates prior information (reference value of variable) necessary for creating a dictionary used for signal separation.

The dictionary (signal pattern) used in the present embodiment can be represented by a general Equation (1) representing a signal value, and includes plural variables.

$$D = m_0 \exp(-R2^*\mathit{eff} \cdot tn) \exp\{i2\pi(fm + Fk)tn\} \quad (1)$$

In the Equation, D is a signal value of a pixel, $m_0$ is a reference signal intensity, R2*eff is an apparent transverse magnetization relaxation rate (effective R2*) in which R2*w of water and R2*f of fat are not separated, tn is an n-th TE, and fm is static magnetic field inhomogeneity (offset frequency). Fk is a resonance frequency of a metabolite k (water and fat components). For water, Fk=0, and the fat components are represented by offset frequencies with respect to water (the same applies hereinafter). Among these, when tn and Fk are known and $m_0$ is a fixed value at $m_0=1$, the effective R2* and fm are variables, and fm can be represented as fm=f0+Δf0m when a reference value is f0.

The prior information calculation unit 231 calculates the effective R2* (R2*eff) and a static magnetic field distribution f0 as the prior information in the Equation (1). Hereinafter, a calculation method will be described.

S21: Calculation of Effective R2* Map

The prior information calculation unit 231 calculates an absolute value of each echo image, and calculates an effective intensity M0 and the effective R2* (R2*eff) by solving a signal equation of an Equation (2) using a least squares method.

$$|sn| = M0\ \exp(-R2^*\text{eff} \cdot tn) \quad (2)$$

In the Equation, sn represents a measured signal at a time tn, and M0 represents a signal intensity obtained by combining all components.

A method for solving the signal equation of the Equation (1) is known, and for example, a method (Solution 1) of executing calculation using a linear least squares method after taking natural logarithms of both sides, a method (Solution 2) of executing calculation using a non-linear least squares method such as a Gauss-Newton method or a Levenberg-Marquardt method, or the like can be adopted.

S22: Calculation of f0 Map

The prior information calculation unit 231 calculates an f0 map using the echo images or the echo signals (complex signals). For example, a known method can be adopted for calculating the f0 map, and for example, in a method (Solution 1) using echo images, after phases of pixel values of the echo images are calculated, folding-back of $-\pi$ to $+\pi$ is removed for pixels, and a gradient of the phases is calculated. Based on the gradient of the phases, a frequency difference is calculated by the following equation. A frequency difference map is obtained by calculating a frequency difference for all the pixels.

$$[\text{Frequency difference}] = [\text{phase gradient}]/2\pi \cdot \Delta TE$$

Next, a water pixel is set as a seed point on a frequency map, and the f0 map is obtained by removing a frequency offset of water and fat using a Region Growing method. As the seed point of the water pixel, for example, a pixel having a minimum error when calculating the effective R2* can be set as the seed point.

As another method for calculating the f0 map, a method (Solution 2) using echo signals described in JP6014266B may be used. In this method, complex signals of echoes are subjected to discrete Fourier transform, and pixel spectrums are calculated. For the pixels, a frequency corresponding to a maximum value of absolute values of the spectrums is calculated. The calculation is performed for all the pixels, and similarly to the Solution 1, a water pixel is set as a seed point, and a frequency offset of water and fat is removed using the Region Growing method.

S3: Creation of Dictionary

The dictionary generation unit 232 creates signal patterns as a dictionary using the effective transverse magnetization relaxation rates R2* and f0 calculated by the prior information calculation unit 231 in the processing (S21, S22) described above.

The signal pattern is represented by an Equation (3), and is created for each of water and fat multiple peaks (resonance frequencies). The Equation (3) is obtained by substituting values obtained by executing variously changing as the values of R2* and f0 in the signal pattern of Equation (1), which is a basic form, with reference to the values of the effective R2* and f0 that are calculated in advance, and is created for each of the pixels.

$$Dk(l,m,n) = m_0 \exp(-R2^* \cdot l \cdot tn) \exp\{i2\pi(fm + Fk)tn\} \quad (3)$$

In the Equation (2), Dk represents a dictionary (signal value) of a k-th substance. In the present embodiment, since seven substances are targeted, k is any one of 1 to 7. l, m, and n represent a positive number of 1 to L, a positive number of 1 to M, and a positive number of 1 to N, respectively. l represents any one of L effective transverse magnetization relaxation rates obtained by changing the effective R2*, m represents any one of M offset frequencies obtained by changing f0, and n represents any one of N different TEs. In addition, R2*1 is an l-th apparent transverse magnetization relaxation rate (R2+1=effective R2*+ $\Delta$R2*1) when R2* is varied, and fm is an m-th offset frequency (fm=f0+$\Delta$f0m) when f0 is varied.

Therefore, for one (k-th) substance, a dictionary including a total number of L×M×N signal patterns is created for each of the pixels. Here, as represented by $$R2^*1 = \text{effective} R2^* + \Delta R2^*1, \text{ and}$$

$$fm = f0 + \Delta f0m,$$

a range of fm and a range of R2*1 to be changed can be set to a limited range based on f0 and effective R2* that are calculated as the prior information, and thus the size of the dictionary can be reduced.

FIGS. 6 and 7 illustrate examples of dictionaries created for each of the substances. FIG. 6 illustrates a dictionary for water, and FIG. 7 illustrates a dictionary for each of peaks of fat. In a graph illustrating the dictionaries, a vertical axis represents the signal intensity, and a horizontal axis represents an echo number (corresponding to TE). In these examples, R2* is changed to 0 [1/sec], 20 [1/sec], and 200 [1/sec], f0 is changed to −10 [Hz], 5 [Hz], and 10 [Hz], and these examples are created for a real part and an imaginary part of the complex signal.

S4: Signal Separation (Variable Estimation) Processing

In this processing, the matching unit 233 sequentially performs estimation processing using the dictionary based on an order of magnitudes of signal intensities of metabolic components obtained as the prior information. FIGS. 8A and 8B illustrate flows of the processing.

S41: Separation of Water and Fat Main Peak

First, water (k=1) having the highest signal intensity and a fat main peak (k=2) having the second highest signal intensity are separated. Therefore, [D1, D2] (combination of D1 and D2) is set as a dictionary Dk of the Equation (1) (S411). The sizes of these dictionaries are (L×M×2)×(number of echoes N).

Next, estimation by pattern matching is performed using the dictionary Dk(S412). For example, taking the dictionary of water illustrated in FIG. 6 as an example, when the dictionary illustrated on a right side of FIG. 6 is set for the real part and the imaginary part of the water signal and the measured signal (real part signal and imaginary part signal) illustrated on a left side of FIG. 6 is obtained as N pieces of measurement data having different echo times, a signal pattern that is most matched with the measured signal is searched among the plural signal patterns forming the dictionary. Dk can be represented by a vector of the number of elements N×1, and the pattern matching is performed by calculating an inner product of the dictionary Dk, which is a vector, and a measured signal sn, and selecting a j-th signal pattern Dk(j) having a maximum inner product.

Next, an inverse matrix invDk(j) of Dk(j) is obtained, and a signal intensity Aj of the signal pattern Dk(j) selected using the measured signal sn is calculated by the following Equation (4).

$$Aj = \text{inv}Dk(j)^* sn \quad (4)$$

Next, values of the water signal or the fat main peak are determined by determining whether the signal intensity Aj thus calculated is for the water signal or the fat main peak signal (S413). This determination is performed based on an index (here, j) of the matched dictionary Dk. Specifically, if $1 \leq j < L \times M$, it is determined that the signal intensity is for water, and a signal value W of water is Aj. In addition, when $L \times M + 1 \leq j < L \times M \times 2$, the signal intensity is for fat, and a signal F1 of the fat main peak is Aj.

A signal of a substance estimated based on the measured signal sn is removed by an Equation (5) (S414)

$$sn' = sn - D(j) * Aj \qquad (5)$$

and by using the removed sn', separation processing of one (for example, fat) whose signal intensity is not determined between water and fat is performed (S415). For example, when the estimated substance is water, signal separation of fat multiple peaks is performed. In the fat separation, S411 and S412 are repeated in the same manner as the separation of the water and the fat main peak described above. At this time, in dictionary selection (S411), pattern matching between the measured signal after the water signal is removed and the dictionary (signal pattern thereof) is performed using the dictionary D2 for the fat main peak (S412). Thereafter, a signal value determined by the signal pattern selected by the pattern matching is regarded as an intensity of the fat main peak without performing the water and fat determination (S413). The dictionary selection (S411) is not performed, and pattern matching between the measured signal after the water signal is removed and the dictionary (signal pattern thereof) is performed using the dictionary D (S412). Thereafter, the water and fat determination (S413) may be performed.

After the determined fat signal is removed from the signal sn' before processing (S414: the same as the Equation (5)), fat signals other than the main peak are separated from the remaining signal (S42, S43). In S143, if the estimated substance is fat, the same processing is performed, using the dictionary D1 for water, on the measured signal after the signal of the estimated substance is removed.

The separation of the fat signals other than the main peak is the same as the signal separation of water and the fat main peak described above, and first, a dictionary of a k-th fat peak is set to Dk. Here, the k-th fat peak is in an order according to the order of the intensities obtained as the prior information for the intensities of the fat multiple peaks, and specifically, when the main peak having the highest intensity among the six peaks illustrated in FIG. 4 is k=1, the peak having the second highest intensity is k=2, and the peak having the third highest intensity is k=3 (the same applies hereinafter). In each case, the size of the dictionary is (L×M)×(number of echoes).

Next, pattern matching using the dictionary Dk is performed on a measured signal sn" after the water signal and the fat main signal are removed, and the dictionary Dk(j) having a maximum inner product is selected.

The inverse matrix invDk(j) of the selected dictionary Dk(j) is obtained, and a signal intensity Ak of the dictionary Dk(j) is calculated according to an Equation (4') similar to the Equation (4) using the measured signal sn".

$$Ak = invDk(j) * sn'' \qquad (4')$$

The signal intensity Ak is the signal intensity estimated for the k-th fat peak.

Thereafter, a measured signal of a k-th fat peak component is removed from the measured signal sn" to be processed (S44). The measured signal after the removal is used as a new signal to be processed, and steps S43 to S44 described above are repeated until processing of a fat peak having the lowest signal intensity is ended (S42).

Finally, the signal intensities of water and the fat components are separated, and the signal intensities can be obtained. In addition, numerical values that are set in a dictionary D (j) selected by the pattern matching can be used as values of R2* (R2*w, R2*f) and f0 of water and fat.

The image generation unit 234 can generate various images using the values of the signal intensities obtained for each of the components by the signal separation processing, R2* of water and fat, and the static magnetic field inhomogeneity map f0. Examples of the images generated by the image generation unit 234 include a water image, a fat image, a fat fraction image, an R2* map of water, an R2* map of fat, the f0 map, a pseudo-in-phase image, and a pseudo-out-of-phase image.

The fat image may be an entire peak image obtained by adding signals separated for each of the peaks, or may be fat images for each of the peaks. Similarly, as the R2* map of fat, R2* maps for each of the fat components can also be generated.

The fat fraction image is an image obtained by calculating ratios (FF) of fat fractions to a total amount of water and fat for each of the pixels, by the quantitative value calculation unit 235, and presenting the ratios as an image. The fat fraction (FF) may be calculated using a complex signal as represented by an Equation (6-1), or may be calculated by obtaining an absolute value based on the complex signal and using a whole value as represented by an Equation (6-2).

$$FF = |fat \div (fat + \text{water})| \times 100 \qquad (6\text{-}1)$$

$$FF = \{|fat| \div (|fat| + |\text{water}|)\} \times 100 \qquad (6\text{-}2)$$

The fat fraction image may also be an image of the entire fat, or may be images for each of the components.

The pseudo-in-phase image is an image when phases of the water signal and the fat signal are aligned (in-phase), and the pseudo-out-of-phase image is an image when the phases of the water signal and the fat signal are reversed (out-of-phase). Although the signal of the TE actually measured is not necessarily in-phase or out-of-phase, a pseudo desired TE image can be obtained by substituting the estimated various amounts into the Equation (3).

Figure 9:
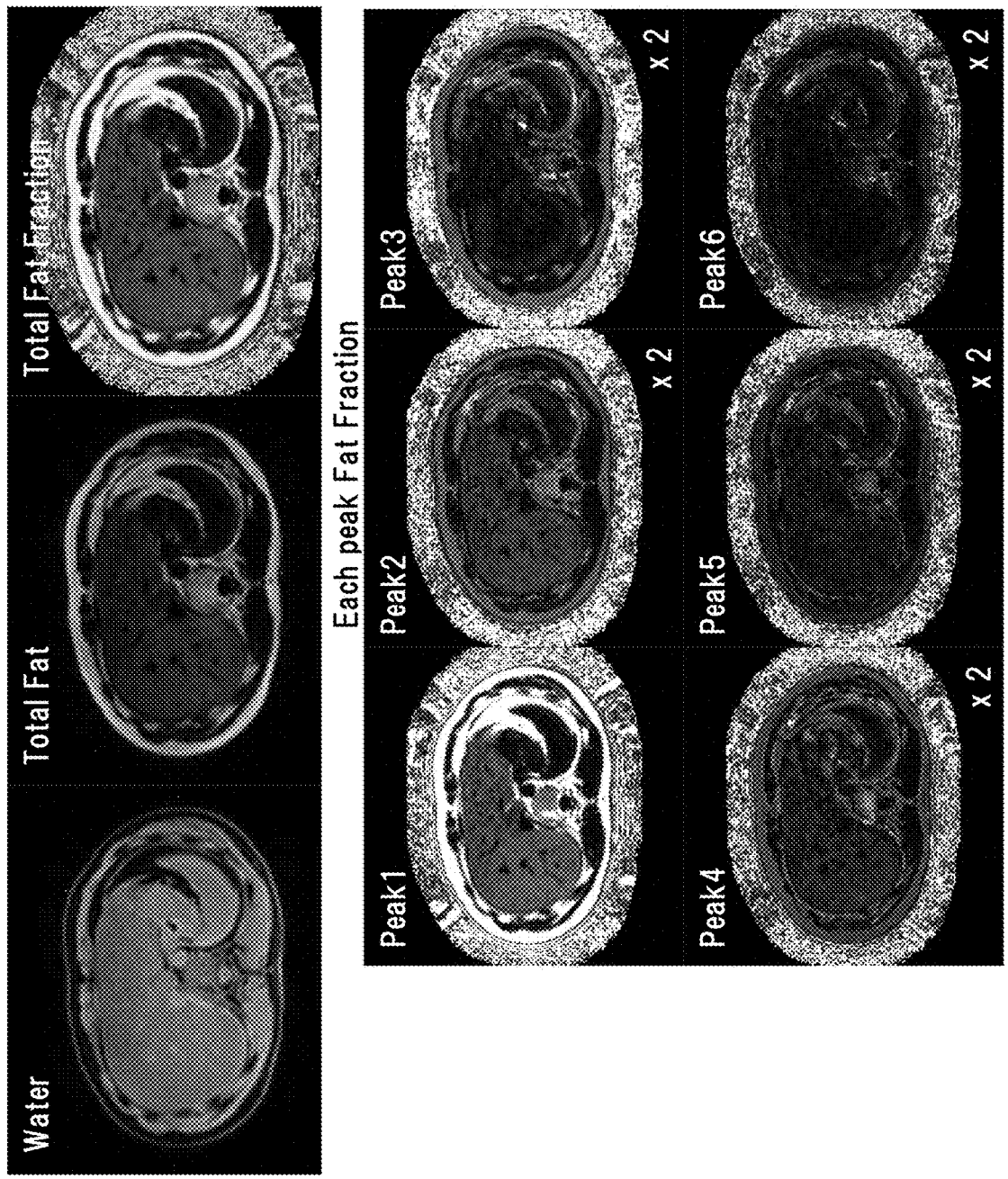
FIG. 9 is a diagram illustrating an example of an image created after the signal separation.

FIG. 9 illustrates an example of the image (abdominal AX plane) generated by the image generation unit 234. An upper side of the image illustrates a water image, a fat image, and a full FF image in this order from the left, and a lower side illustrates FF images of the fat peaks. As illustrated, according to the present embodiment, in addition to the fat image or the full fat FF image showing a distribution of the entire fat, images or FF images for each of the peaks can be created and displayed. Accordingly, for a tissue in which the amount and type of fat deposited along with the progress of a disease of the liver or the like change, information effective for diagnosis can be provided.

Although not illustrated in FIG. 9, since the R2* maps for water and fat (for the entire fat and each of the components) can also be generated, a change in iron deposition of chronic hepatitis can be grasped based on a change in R2* over time.

Second Embodiment

In the first embodiment, the effective R2* map and the static magnetic field inhomogeneity f0 are calculated based on the measurement data as the prior information, but errors are contained therein. In a second embodiment, as illustrated in FIG. 10, a step (S23) of precisely estimating the effective R2* and the magnetic field inhomogeneity map f0 that are calculated by the prior information calculation unit 231 is added. The other processing is the same as the processing according to the first embodiment illustrated in FIG. 5, and the present embodiment will be described below focusing on differences from the first embodiment.

In the present embodiment, as illustrated in FIG. 11, a reference value estimation unit 236 is added to the prior information calculation unit 231. The reference value estimation unit 236 substitutes f0 and R2*, which are the reference values calculated by the prior information calculation unit 231 in steps S21 and S22, into a signal model of water or a fat main peak, and calculates the reference value again. The following Equation (6) is an example of an Equation using a fat signal model, and here, R2* is defined as "R2* of one component+fixed offset", and f0 is defined as "reference f0+offset frequency $f_{fat}$=resonance frequency of fat main peak".

$$sn=\{\rho_w+\rho_f e^{i2\pi f fat \cdot tn} \cdot e^{nR2^* offset \cdot tn}\} e^{nR2^*} t_n e^{i2\pi f 0 tn} \quad (6)$$

Where $\rho_w$ is an intensity of a water signal, $\rho_f$ is an intensity of a fat signal, and $f_{fat}$ is a resonance frequency (offset frequency) of the fat main peak. $R2^*_{offset}$ represents an offset value when the apparent transverse magnetization relaxation rate $R2^*f$ of fat is represented by the apparent transverse magnetization relaxation rate $R2^*w$ of water and an offset value for the apparent transverse magnetization relaxation rate $R2^*w$ (that is, $R2^*f$=offset value+$R2^*w$), and is set as a fixed value here.

In this signal model, $\rho w$, $\rho f$, $f_0$, and $R2^*$ are unknown, and by using five or more pieces of measurement data, the unknowns can be calculated by a non-linear least squares method. The calculated $f_0$ and $R2^*$ are set as the reference values f0 and R2* for creating a dictionary (signal pattern) of fat.

Instead of the Equation (6), a signal model described in U.S. Pat. No. 7,202,665B or US7, 468, 605B may be used.

Water and fat separation (each step in FIG. 8) is performed using the refined f0 and R2* as reference values in the same manner as in the first embodiment.

Since f0 usually takes a value in a wider range than –1000 Hz to 1000 Hz, the size of the dictionary D that is intended to cover the range increases. However, in the present embodiment, by raising a precision of f0 set as a reference value, the range of f0 to be changed in the dictionary can be limited to a narrower range such as ±10 Hz, and the size of the dictionary can be significantly reduced. In addition, since an increment of f0 to be changed can be reduced, the signal intensities for each of the components can be estimated with higher accuracy, and accuracy of the signal separation can be improved. The same applies to R2*.

What is claimed is:

1. A magnetic resonance imaging apparatus comprising:
a measurement unit configured to measure a nuclear magnetic resonance signal generated from a subject; and
an arithmetic unit configured to perform an arithmetic operation including image reconstruction using the nuclear magnetic resonance signal, wherein
the arithmetic unit includes a signal separation unit configured to separate signals for respective plural metabolites contained in the subject using plural images created based on nuclear magnetic resonance signals collected by the measurement unit at different echo times, and
the signal separation unit includes:
a dictionary generation unit configured to create, as a dictionary, plural signal patterns created by changing values of plural variables for each of the metabolites using prior information, and
a matching unit configured to perform pattern matching between the dictionary for each of the metabolites created by the dictionary generation unit and the signal measured by the measurement unit and to select a most matched dictionary.

2. The magnetic resonance imaging apparatus according to claim 1, wherein
the prior information includes information on resonance frequencies and an order of signal intensities of the plural metabolites, and
the signal separation unit is configured to sequentially execute selection of the dictionary for each of the metabolites and matching using the selected dictionary according to the prior information, and to separate the signals of the metabolites.

3. The magnetic resonance imaging apparatus according to claim 2, wherein
the signal separation unit further includes a prior information calculation unit configured to calculate a reference value of the variables of the signal patterns as the prior information, and
the dictionary generation unit is configured to create plural signal patterns by changing the values of the variables based on the reference value.

4. The magnetic resonance imaging apparatus according to claim 3, wherein
the prior information includes a relative relationship between a transverse magnetization relaxation time of water and a transverse magnetization relaxation time of fat.

5. The magnetic resonance imaging apparatus according to claim 3, wherein
the prior information calculation unit is configured to calculate a reference value f0 of a frequency distribution caused by static magnetic field inhomogeneity using plural images having different echo times.

6. The magnetic resonance imaging apparatus according to claim 3, wherein
the prior information calculation unit is configured to calculate an effective apparent transverse magnetization relaxation rate (R2*) common to the plural metabolites using plural images having different echo times.

7. The magnetic resonance imaging apparatus according to claim 3, wherein
the prior information calculation unit further includes a reference value estimation unit configured to estimate at least one of an apparent transverse magnetization relaxation rate (R2*) and a frequency distribution f0 of the plural metabolites using a signal model and to set the estimated one as a reference value of the dictionary.

8. The magnetic resonance imaging apparatus according to claim 1, wherein
the signal pattern created by the dictionary generation unit as a dictionary is a time-series signal pattern or a spectral signal pattern.

9. The magnetic resonance imaging apparatus according to claim 1, wherein
the plural metabolites contain at least two of water, fat, and choline.

10. The magnetic resonance imaging apparatus according to claim 9, wherein
the fat includes plural types of metabolites having different resonance frequencies.

11. The magnetic resonance imaging apparatus according to claim 1, further comprising:
an image creation unit configured to create images representing characteristics of the metabolites using the signals for the respective metabolites separated by the signal separation unit.

12. The magnetic resonance imaging apparatus according to claim 11, wherein
the images created by the image creation unit include any one of an image including one or a type of signal value of a metabolite, an image including signal values of plural substances contained in a type of metabolite, an image showing one or a type of ratio of a metabolite, an image showing one transverse magnetization relaxation rate (R2*) of a metabolite, an f0 map, and a pseudo image of an echo time in which phases of two types of metabolites are aligned or reversed.

13. An image processing apparatus for processing plural images created based on nuclear magnetic resonance signals collected at different echo times by magnetic resonance imaging, the image processing apparatus comprising:
a signal separation unit configured to separate signals for respective plural metabolites contained in a subject generating a nuclear magnetic resonance signal, wherein
the signal separation unit includes:
a dictionary generation unit configured to create, as a dictionary, plural signal patterns created by changing values of plural variables for each of the metabolites using prior information, and
a matching unit configured to perform pattern matching between the dictionary for each of the metabolites created by the dictionary generation unit and the measured signal and to select a most matched dictionary.

14. A signal separation method for processing plural images created based on nuclear magnetic resonance signals measured at different echo times by magnetic resonance imaging and separating signals for respective plural metabolites contained in a subject generating a nuclear magnetic resonance signal, the signal separation method comprising:
a dictionary creation step of inputting information on resonance frequencies and an order of signal intensities of the plural metabolites as prior information and creating, as a dictionary, plural signal patterns having different values for each of the metabolites; and
a matching step of performing pattern matching between the created plural signal patterns and the measured signal and selecting a most matched signal pattern, wherein
selection of the dictionary and matching between a signal pattern included in the selected dictionary and the measured signal are sequentially performed according to the order of the signal intensities of the plural metabolites, and the signals of the metabolites are separated.

15. The signal separation method according to claim 14, wherein
the dictionary creation step includes:
a frequency distribution calculation step of calculating a frequency distribution f0 caused by static magnetic field inhomogeneity using plural images having different echo times; and
an effective R2* map calculation step of calculating an effective apparent transverse magnetization relaxation rate (R2*) for the plural metabolites using the plural images, and
the frequency distribution f0 and the effective R2* are used as one piece of the prior information to create the dictionary for each of the metabolites.

* * * * *